(12) United States Patent
Kito et al.

(10) Patent No.: US 6,917,064 B2
(45) Date of Patent: Jul. 12, 2005

(54) TRENCH CAPACITOR AND A METHOD FOR MANUFACTURING THE SAME

(75) Inventors: Masaru Kito, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/752,503

(22) Filed: Jan. 8, 2004

(65) Prior Publication Data

US 2005/0077559 A1 Apr. 14, 2005

(30) Foreign Application Priority Data

Oct. 10, 2003 (JP) ........................................ 2003-352346

(51) Int. Cl.[7] ............................................ H01L 27/108
(52) U.S. Cl. ....................... 257/301; 257/296; 257/303; 257/304; 257/306; 257/311; 257/532; 438/243; 438/386
(58) Field of Search ................................. 257/532, 296, 257/301, 303, 304, 306, 311; 438/238, 239, 386, 399, 243

(56) References Cited

U.S. PATENT DOCUMENTS 5,905,279 A     5/1999 Nitayama et al.
6,117,726 A  *  9/2000 Tsai et al. .................... 438/242
6,200,873 B1    3/2001 Schrems et al.
6,236,079 B1 *  5/2001 Nitayama et al. ........... 257/306
6,238,967 B1 *  5/2001 Shiho et al. ................. 438/244

FOREIGN PATENT DOCUMENTS

JP        2000-200887        7/2000

* cited by examiner

Primary Examiner—Nathan J. Flynn
Assistant Examiner—Scott R. Wilson
(74) Attorney, Agent, or Firm—Finnegan, Henderson, Farabow, Garrett & Dunner, L.L.P.

(57) ABSTRACT

A trench capacitor comprises a semiconductor substrate, a trench, formed in the semiconductor substrate, having upper and lower portions, a first doped polysilicon layer filled in the lower portion through a first dielectric film and doped with a first impurity having a first conductivity type, at least a second doped polysilicon layer filled in the upper portion through a second dielectric film and doped with a second impurity different from the first impurity, the second impurity having the first conductivity type, and a buried strap layer provided on the second doped polysilicon layer and composed of the first doped polysilicon layer.

8 Claims, 6 Drawing Sheets

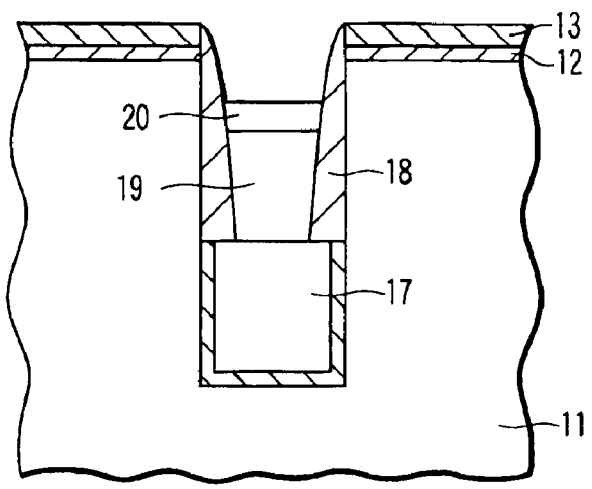
F I G. 4
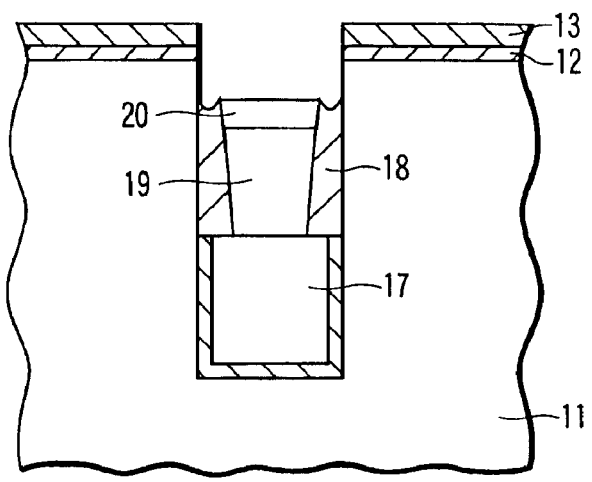
F I G. 5
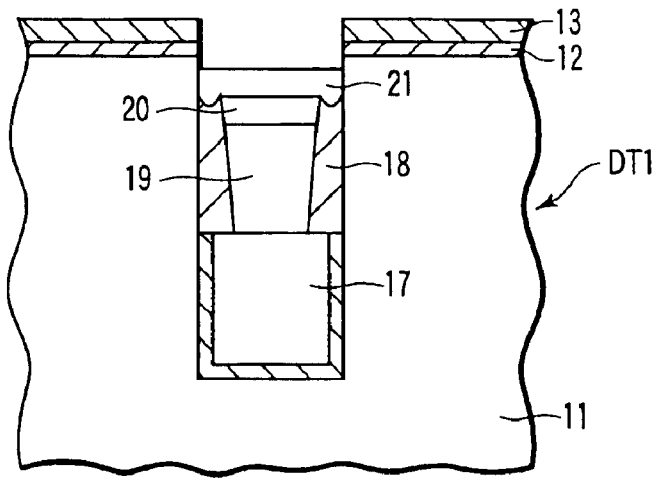
F I G. 6

TRENCH CAPACITOR AND A METHOD FOR MANUFACTURING THE SAME

CROSS-REFERENCE TO RELATED APPLICATIONS

This application is based upon and claims the benefit of priority from the prior Japanese Patent Application No. 2003-352346, filed Oct. 10, 2003, the entire contents of which are incorporated herein by reference.

BACKGROUND OF THE INVENTION

1. Field of the Invention

The present invention relates to a semiconductor device and a method for manufacturing the same and, in particular, to a trench capacitor in a semiconductor memory device such as a DRAM and a method for manufacturing the same.

2. Description of the Related Art

In a manufacturing process and structure of a trench capacitor in the conventional technique, a polysilicon of a storage node section is limited to one either wholly formed of an As (Arsenic)-doped polysilicon or partly using a non-doped polysilicon.

That is, as shown in FIG. 17, a trench 52 is provided in a P-type silicon substrate 51 and, in the trench 52, an As-doped polysilicon layer 55 is buried through an insulating film 53 and collar insulating film 54, and an As-doped buried strap layer 56 is formed on the As-doped polysilicon layer 55.

Further, an isolation region 57 is provided by an STI technique on the surface portion of the trench capacitor. Adjacent to the trench capacitor a gate electrode 62 is provided on the surface of a substrate through a gate insulating film 61. A sidewall insulating film 63 is formed on the side surface of the gate electrode 62. Further, a source or drain region 64 is provided and, through the diffusion of As from the As-doped buried strap layer 56, a strap region 65 is so formed as to overlap the source or drain region 64.

Since, in this case, the diffusion coefficient is small, the BS (Buried Strap) diffusion length is shorter to provide an advantage of, for example, suppressing a short channel effect of a cell transistor. However, since the junction edge of the BS diffusion region is As, the junction leakage is increased to degrade the data retaining characteristic.

In order to eliminate such a disadvantage, in the prior art, such countermeasures are taken that, after the wet treatment of the collar oxide film, phosphorus (P) ions are implanted into a silicon sidewall or that after etching back the As-doped polysilicon layer 55, P ions are implanted from a vertical direction to cover a junction 58 below the BS diffusion region with P.

However the above-mentioned methods are breaking down due to the fine device structure of the design rule. Further, in the method of directly implanting P into the BS sidewall, P is implanted to a given depth from the side surface of the substrate at the ion implantation. Therefore, P will be more deeply diffused by a later thermal process, thereby degrading the characteristics of transistors.

In the case where after the As-doped polysilicon layer is etched back, P is implanted vertically from a direction of an upper portion, an effect of P contamination will be exerted, due to its lateral diffusion at the ion implantation, not only on significant bit cells but also on adjacent bit cells, so that the characteristics of the transistors will be similarly degraded.

BRIEF SUMMARY OF THE INVENTION

According to an aspect of the present invention, a trench capacitor comprises a semiconductor substrate; a trench, formed in the semiconductor substrate, having upper and lower portions; a first doped polysilicon layer filled in the lower portion through a first dielectric film and doped with a first impurity having a first conductivity type; at least a second doped polysilicon layer filled in the upper portion through a second dielectric film and doped with a second impurity different from the first impurity, the second impurity having the first conductivity type; and a buried strap layer provided on the second doped polysilicon layer and composed of the first doped polysilicon layer.

BRIEF DESCRIPTION OF THE DRAWINGS

FIG. 4 is a cross-sectional view schematically showing a part of the manufacturing process of the trench capacitor according to the first embodiment;

FIG. 5 is a cross-sectional view schematically showing a part of the manufacturing process of the trench capacitor according to the first embodiment;

FIG. 6 is a cross-sectional view schematically showing a part of the manufacturing process of the trench capacitor according to the first embodiment;

DETAILED DESCRIPTION OF THE EMBODIMENTS

With reference to FIGS. 1 to 8, a structure of a trench capacitor will be described together with its method as a first embodiment.

Figure 1:
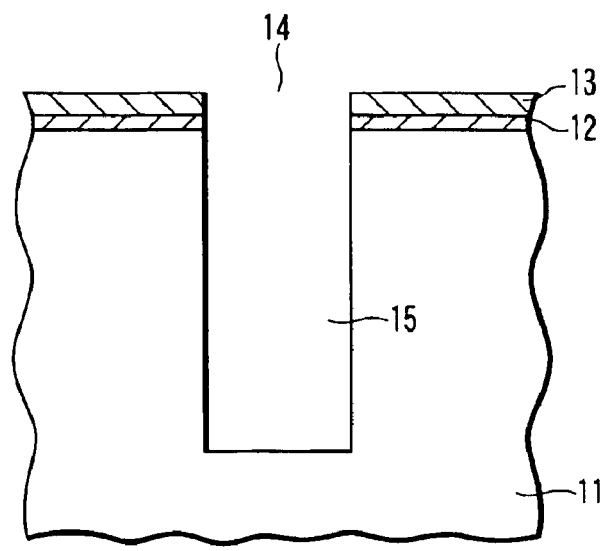
FIG. 1 is a cross-sectional view schematically showing a part of a manufacturing process of a trench capacitor according to a first embodiment.

As shown in FIG. 1, for example, a silicon oxide film 12 and a silicon nitride film 13 are sequentially formed on a surface of a P-type silicon substrate 11 to thicknesses of 20 Å and 2200 Å, respectively. Thereafter, an opening 14 is formed in the silicon nitride film 13, using a lithography technique and dry etching.

A trench 15 having, for example, a depth of 1.5 μm and a width of 0.14 μm is formed in the semiconductor substrate 11, using the silicon nitride film 13 having the opening 14 as a mask. As known in the art, an N-type impurity is diffused into the substrate to provide a buried plate, not shown, around the trench 15.

Figure 2:
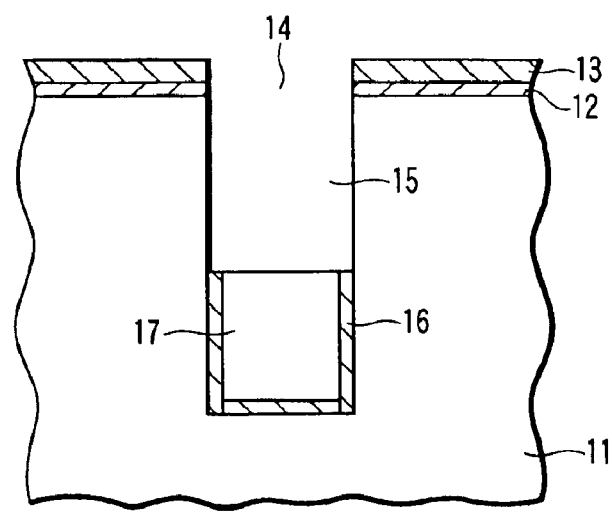
FIG. 2 is a cross-sectional view schematically showing a part of the manufacturing process of the trench capacitor according to the first embodiment.

As shown in FIG. 2, for example, a silicon nitride film 16 is deposited to a thickness of 50 Å (Angstrom) on an exposed inner wall of the trench 15. As a storage node electrode, an As-doped amorphous silicon 17 is buried in the trench 15. Thereafter, the As-doped amorphous silicon 17 is etched back to a desired depth of, for example, about 1.3 μm and, at the same time, the silicon nitride film 16 is removed.

Figure 3:
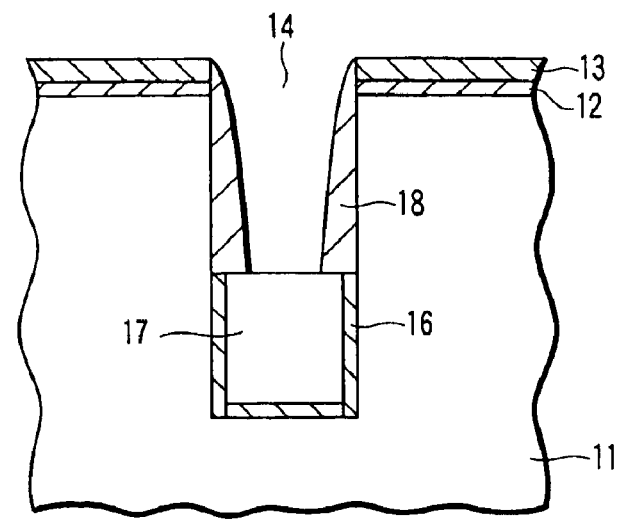
FIG. 3 is a cross-sectional view schematically showing a part of the manufacturing process of the trench capacitor according to the first embodiment.

As shown in FIG. 3, after a thermal oxide film is formed to a thickness of 60 Å on the exposed inner wall of the trench, a collar oxide film 18 such as TEOS is deposited to a thickness of 400 Å. Thereafter, only the collar oxide film 18 is removed from the bottom of the trench 15 to expose the surface of the buried As-doped amorphous silicon 17.

As shown in FIG. 4, an As-doped amorphous silicon 19 is buried on the As-doped amorphous silicon 17. Then, the As-doped amorphous silicon 19 is etched back to a desired depth of, for example, 1200 Å.

Thereafter, a pre-treatment, such as dry cleaning, is performed and a P (phosphorus)-doped amorphous silicon 20 is buried and etched back to a depth of, for example, about 900 Å.

As shown in FIG. 5, the exposed collar oxide film 18 is removed by wet etching using the hydrofluoric acid. Therefore, an opening of a buried strap can be provided which electrically connect the storage node to the silicon substrate 11.

As shown is FIG. 6, an As-doped amorphous silicon 21 is deposited and is etched back to a desired depth of, for example, about 300 Å to provide a buried strap contact. Since, in this case, the P-doped amorphous silicon 20 is buried to a level corresponding to a depth of 900 Å to 600 Å where the storage node polysilicon is positioned, As and P are, together, diffused in a later thermal process to cover the buried strap junction edge with P. At this time, the buried amorphous silicon becomes a polysilicon. In this way, a trench capacitor DT1 is completed.

Further, by varying the etch-back depth of the P-doped amorphous silicon 20, it is possible to vary the amount and/or position of the P-doped amorphous silicon, thereby to increase the conformity in a device, that is, to increase the degree of freedom for the design and optimization of the device.

Figure 7:
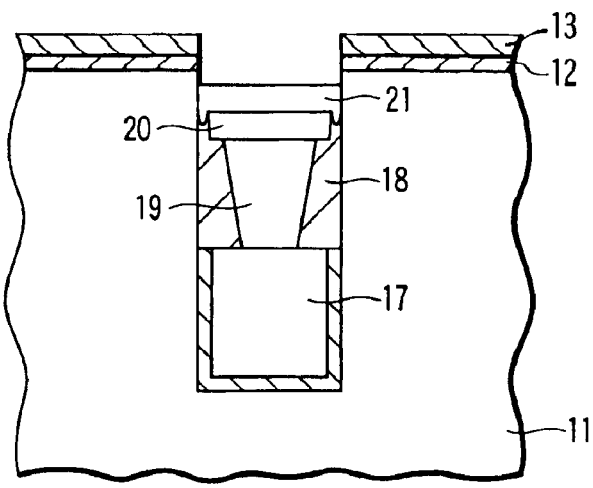
FIG. 7 is a cross-sectional view schematically showing a part of the manufacturing process the trench capacitor according to the first embodiment.

In FIG. 4, since the pre-treatment such as dry cleaning is performed in burying the P-doped amorphous silicon 20, the film thickness of the collar oxide film 18 is not changed, but, if the pre-treatment is performed using a dilute hydrofluoric acid, as shown in FIG. 7, the collar oxide film 18 will be partly thrusted back, that is, a thickness of the upper portion of the collar oxide film 18 will be reduced to increase the width of the buried P-doped amorphous silicon. That is, the amount of the P-doped amorphous silicon can be increased.

Figure 8:
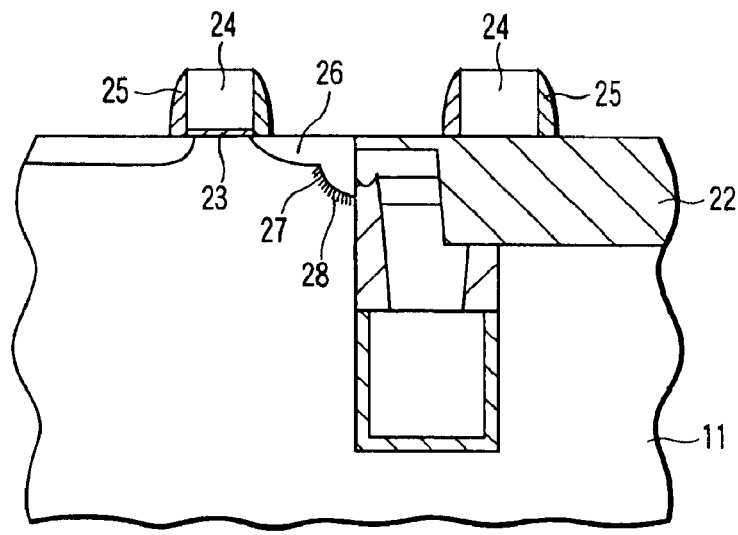
FIG. 8 is a cross-sectional view schematically showing a part of the trench capacitor and a cell transistor according to the first embodiment.

As shown in FIG. 8, as in the case of the prior art, an STI process is performed for the trench capacitor DT1 to provide a silicon oxide film 22 for element isolation. Thereafter, the silicon nitride film 13 which was used as a mask is removed and the ion implantation for a desired channel and a well is performed on respective cell transistor regions. After the silicon oxide film 12 is removed from the substrate surface, a gate electrode 24 is formed through a gate insulating film 23 and a sidewall insulating film 25 is formed on the gate electrode. Thereafter, arsenic (As) of an N-type impurity is implanted into the silicon substrate 11 to provide a source or drain region 26.

By the heat-treatment in such processing, as described above, As and P in the As-doped and P-doped polysilicon layers 21 and 20 are both diffused, so that a buried strap junction edge 27 can be covered with P at a region 28 as indicated by oblique lines in FIG. 8.

With reference to FIGS. 9 to 16, a structure of a trench capacitor will be described together with its method as a second embodiment.

Figure 9:
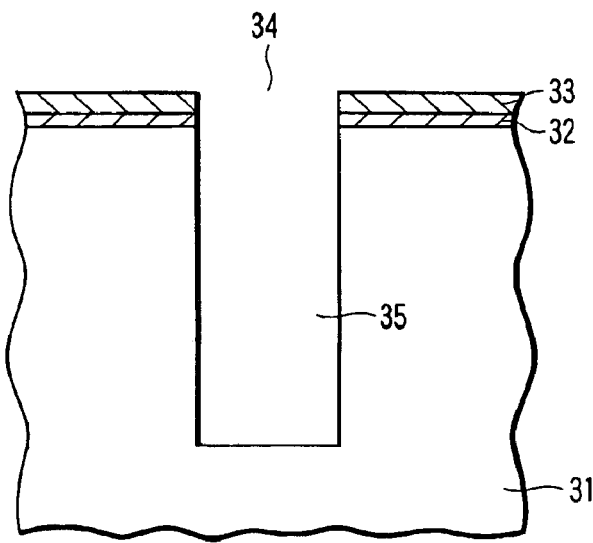
FIG. 9 is a cross-sectional view schematically showing a part of a manufacturing process of a trench capacitor according to a second embodiment.

As shown in FIG. 9, for example, a silicon oxide film 32 and a silicon nitride film 33 are sequentially formed on the surface of a P-type silicon substrate 31 to thicknesses of 20 Å and 2200 Å, respectively, and an opening 34 is formed in the silicon nitride film 33, using the lithography technique and dry etching.

A trench 35 having, for example, a depth of 1.5 μm and a width of 0.14 μm is formed in the semiconductor substrate 31, using the silicon nitride film 33 having the opening 34 as a mask. As known in the art, an N-type impurity is diffused to form a buried plate, not shown, around the trench 35.

Figure 10:
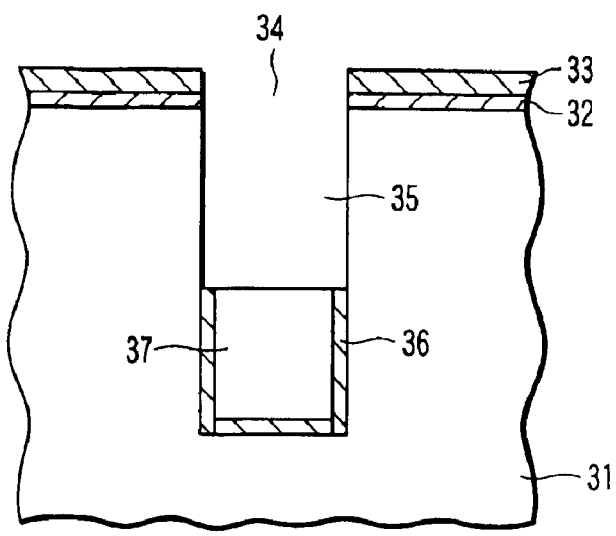
FIG. 10 is a cross-sectional view schematically showing a part of the manufacturing process of the trench capacitor according to the second embodiment.

As shown in FIG. 10, for example, a silicon nitride film 36 is deposited to a thickness of 50 Å on an exposed inner wall of the trench 35. As (arsenic)-doped amorphous silicon 37 is buried in the trench 35 to provide a storage node electrode. Thereafter, the As-doped amorphous silicon 37 is etched back to a desired depth of, for example, about 1.3 μm and, at the same time, the silicon nitride film 36 is removed.

Figure 11:
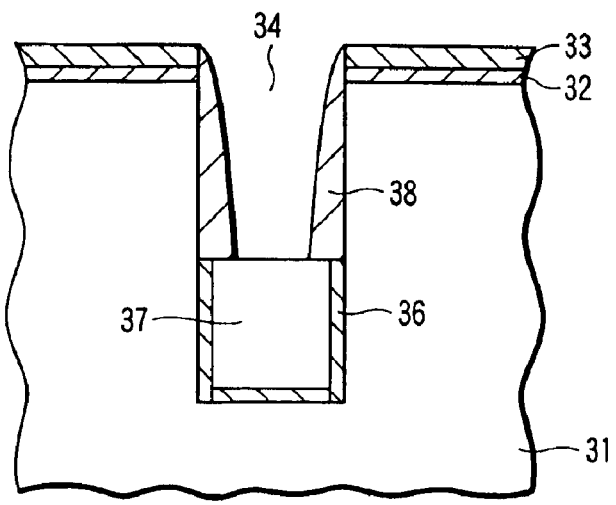
FIG. 11 is a cross-sectional view schematically showing a part of the manufacturing process of the trench capacitor according to the second embodiment.

As shown in FIG. 11, after a thermal oxide film is formed to a thickness of 60 Å on an exposed inner wall of the trench, a collar oxide film 38 such as TEOS is deposited thereon. Thereafter, the collar oxide film 38 is removed from only the bottom of the trench 35 by the dry etching to expose the surface of the buried As-doped amorphous silicon 37. These process steps are similar to those in FIGS. 1 to 3 of the first embodiment.

Figure 12:
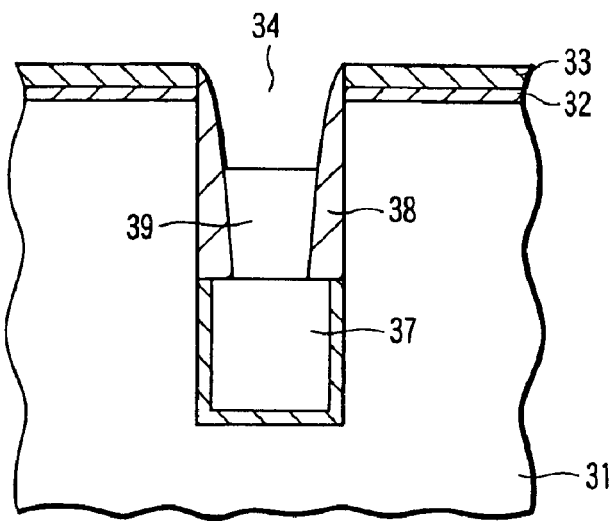
FIG. 12 is a cross-sectional view schematically showing a part of the manufacturing process of the trench capacitor according to the second embodiment.

As shown in FIG. 12, a P-doped amorphous silicon 39 is deposited on the As-doped amorphous silicon 37 and etched back to a desired depth of, for example, 2000 Å.

Figure 13:
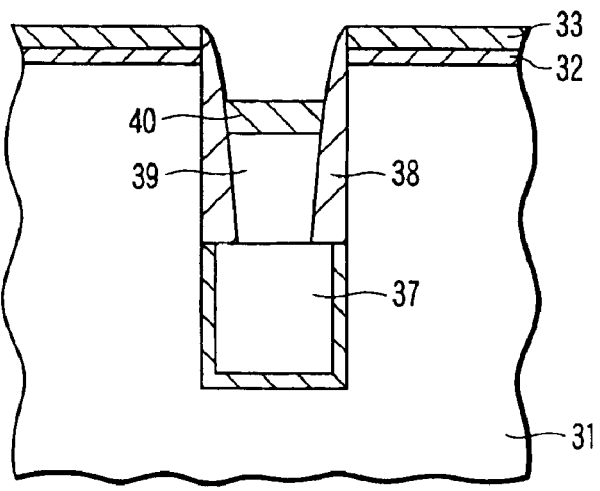
FIG. 13 is a cross-sectional view schematically showing a part of the manufacturing process of the trench capacitor according to the second embodiment.

As shown in FIG. 13, a resist 40 is coated on the P-doped amorphous silicon 39 and etched back, for example, by CDE (Chemical Dry Etching) to a desired depth of, for example, about 700 Å.

Figure 14:
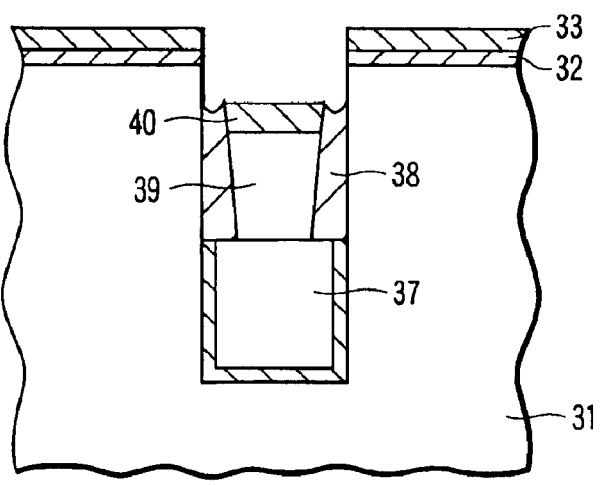
FIG. 14 is a cross-sectional view schematically showing a part of the manufacturing process of the trench capacitor according to the second embodiment.

Thereafter, as shown in FIG. 14, a portion of the collar oxide film 38 exposed on the sidewall is removed by the wet etching using the hydrofluoric acid to provide an opening of a buried strap for making an electrical connection between the storage node and the silicon substrate 31.

Figure 15:
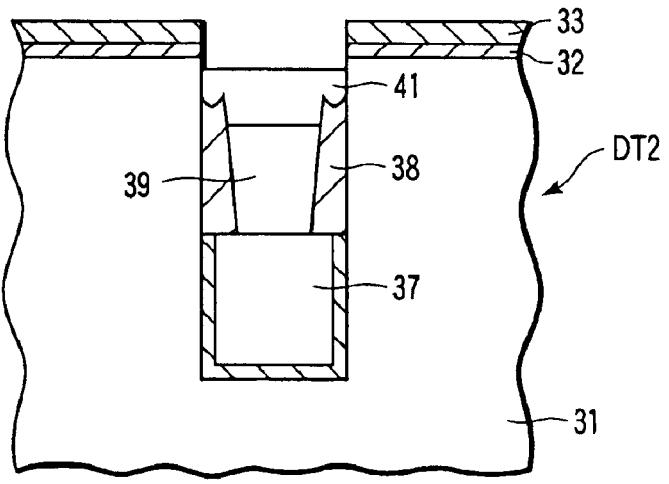
FIG. 15 is a cross-sectional view schematically showing a part of the manufacturing process of the trench capacitor according to the second embodiment.

As shown in FIG. 15, after removing the resist 40, an As-doped amorphous silicon 41 is deposited and etched back to a desired depth of, for example, about 300 Å to provide a buried strap contact. Since, in this case, the P-doped amorphous silicon 39 is buried to a level corresponding to a depth of 0.2 μm to 1.3 μm of the storage node polysilicon, As and P are simultaneously diffused in a later thermal process to cover the buried strap junction edge with P. At this time, the buried amorphous silicon becomes a polysilicon. In this way, a trench capacitor DT2 is completed.

In the same manner as the first embodiment, by varying the etch-back depth of the P-doped amorphous silicon 39, it is possible to vary the amount and/or position of the P-doped amorphous silicon and to increase the conformity in the device, that is, to increase the degree of freedom for the design and optimization of the device.

Figure 16:
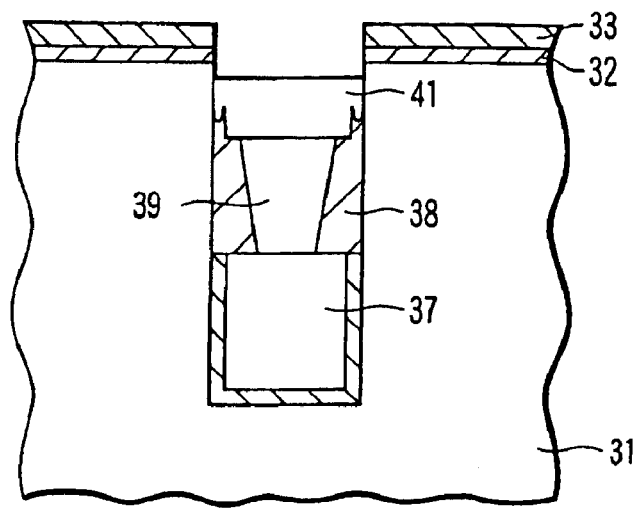
FIG. 16 is a cross-sectional view schematically showing a part of the manufacturing process of the trench capacitor according to the second embodiment.
Figure 17:
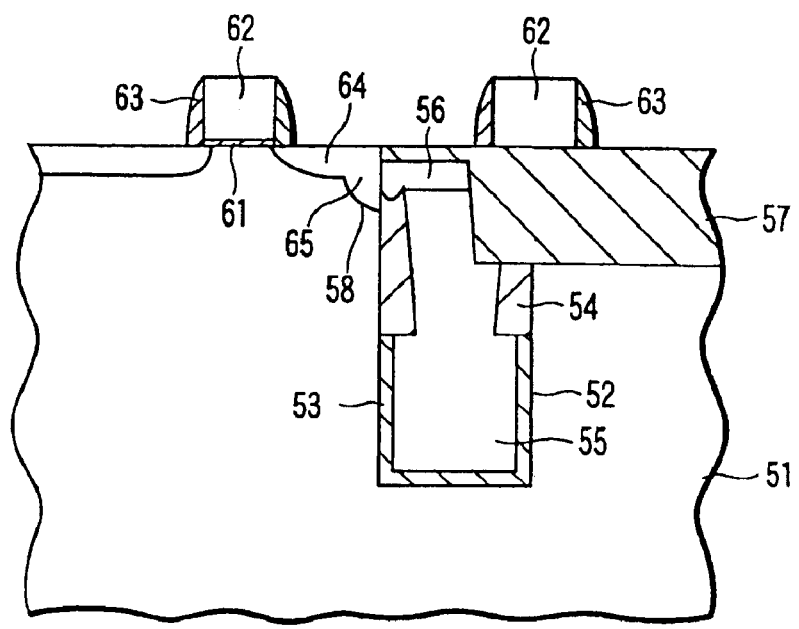
FIG. 17 is a cross-sectional view schematically showing a part of a conventional trench capacitor and a cell transistor.

In FIG. 15, since the pre-treatment such as the dry cleaning is performed in burying the As-doped amorphous silicon, the film thickness of the collar oxide film 38 is not changed and, if the pre-treatment is performed using the dilute hydrofluoric acid as shown in FIG. 16, a part of the upper portion of the collar oxide film 18 is removed to increase the width of the buried As-doped amorphous silicon, that is, to increase the amount of the As doped amorphous silicon.

In the same manner as FIG. 8 in the first embodiment, the STI process is performed for such trench capacitor DT2 to provide isolation regions and cell transistors.

Similarly, by the heat-treatment in such processes As and P in the As-doped polysilicon layer 41 and P-doped polysilicon 39 are simultaneously diffused into the outside to cover a buried strap junction edge with P.

That is, as evident from the first and second embodiments, the polysilicon layer for providing the storage node is doped with P. Therefore, P and As will be simultaneously diffused under the heat-treatment in various kinds of processes. At this time, since the diffusion coefficient of P is greater than that of As, P will be diffused somewhat toward the outer side. Therefore, such profile will be obtained that a boundary of a BS junction is covered with P. It can be, therefore, possible to reduce a junction leak and to enhance the data holding characteristic (pose characteristic).

Further, in the upper portion of the storage node, the diffused layer having the high interfacial concentration and the short diffusion length is provided by the As-doped polysilicon. It is thus possible to make the BS layer lower in resistance without deteriorating the characteristics of the cell transistors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A trench capacitor comprising:

a semiconductor substrate;

a trench formed in the semiconductor substrate;

a first doped polysilicon layer filled in the trench through a first dielectric film and doped with a first impurity having a first conductivity type;

a second doped polysilicon layer filled in the trench through a second dielectric film, formed on the first doped polysilicon layer and doped with the first impurity having the first conductivity type;

a third doped polysilicon layer formed on the second doped polysilicon layer through the second dielectric film and doped with a second impurity having the first conductivity type, the second impurity being different from the first impurity and having a greater diffusion coefficient than that of the first impurity; and a fourth doped polysilicon layer provided in the trench, formed on the third doped polysilicon layer and doped with the first impurity having the first conductivity type.

2. The trench capacitor according to claim 1, wherein the first impurity is arsenic and the second impurity is phosphorus.

3. The trench capacitor according to claim 1, wherein the fourth doped polysilicon layer is a buried strap layer.

4. The trench capacitor according to claim 1, wherein the impurity concentration of the second doped polysilicon layer is varied.

5. The trench capacitor according to claim 1, wherein the amount of the second doped polysilicon is varied.

6. The trench capacitor according to claim 1, wherein the first dielectric film is a silicon nitride film.

7. The trench capacitor according to claim 1, wherein the second dielectric film is a collar oxide film.

8. The trench capacitor according to claim 1, wherein a buried strap junction edge is covered with phosphorus.

* * * * *